United States Patent
Nakanishi et al.

(10) Patent No.: US 7,932,141 B2
(45) Date of Patent: Apr. 26, 2011

(54) SEMICONDUCTOR DEVICE AND METHOD FOR FABRICATING THE SAME

(75) Inventors: Kentaro Nakanishi, Nara (JP); Hiromasa Fujimoto, Osaka (JP); Takayuki Yamada, Osaka (JP)

(73) Assignee: Panasonic Corporation, Osaka (JP)

( * ) Notice: Subject to any disclaimer, the term of this patent is extended or adjusted under 35 U.S.C. 154(b) by 206 days.

(21) Appl. No.: 12/164,635

(22) Filed: Jun. 30, 2008

(65) Prior Publication Data

US 2009/0020822 A1    Jan. 22, 2009

(30) Foreign Application Priority Data

Jul. 18, 2007    (JP) .................................. 2007-186815

(51) Int. Cl.
*H01L 21/3205* (2006.01)
(52) U.S. Cl. .......................... 438/197; 257/369
(58) Field of Classification Search .................. 438/197; 257/369, E27.108
See application file for complete search history.

(56) References Cited

U.S. PATENT DOCUMENTS

| | | | |
|---|---|---|---|
| 6,906,360 B2 | 6/2005 | Chen et al. | |
| 7,407,860 B2 * | 8/2008 | Kim et al. | 438/300 |
| 2003/0181005 A1 * | 9/2003 | Hachimine et al. | 438/231 |
| 2004/0029323 A1 * | 2/2004 | Shimizu et al. | 438/142 |
| 2006/0157797 A1 * | 7/2006 | Tateshita | 257/369 |
| 2009/0309166 A1 * | 12/2009 | Shima | 257/369 |

OTHER PUBLICATIONS

Lee, W. H. et al., "High Performance 65 nm SOI Technology with Enhanced Transistor and Advanced-Low-K BEOL," IEDM 2005, pp. 61-64.

* cited by examiner

*Primary Examiner* — Thao Le
(74) *Attorney, Agent, or Firm* — McDermott Will & Emery LLP

(57) ABSTRACT

A semiconductor device includes an n-type MIS transistor and a p-type MIS transistor. The n-type MIS transistor includes a first gate electrode formed on a first active region and a first sidewall formed on the side face of the first gate electrode. The p-type MIS transistor includes a second gate electrode formed on a second active region, a second sidewall formed on the side face of the second gate electrode and strain layers formed in the second active region. The second sidewall has a smaller thickness than the first sidewall.

16 Claims, 11 Drawing Sheets

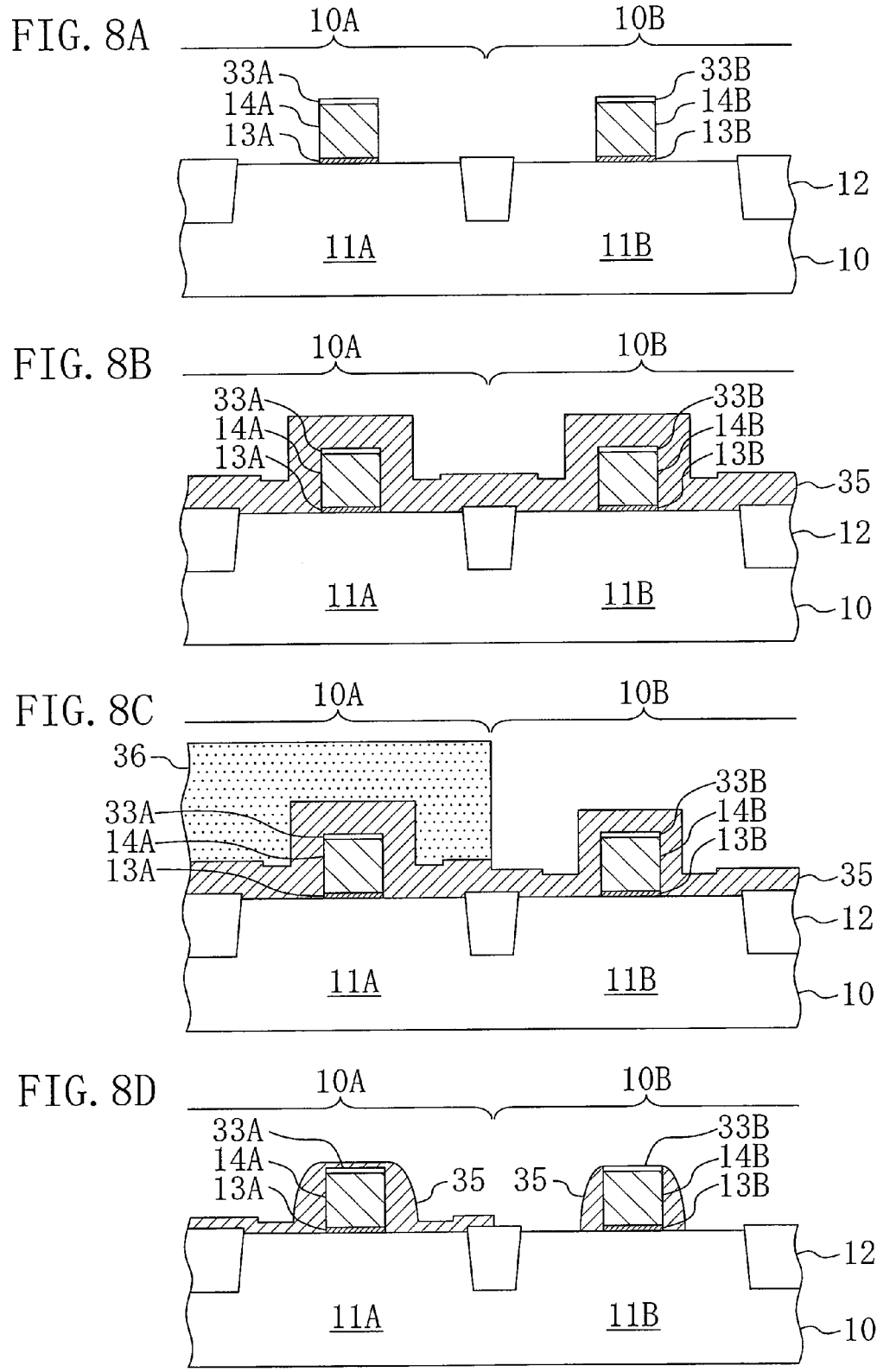

SEMICONDUCTOR DEVICE AND METHOD FOR FABRICATING THE SAME

CROSS-REFERENCE TO RELATED APPLICATIONS

This application claims priority under 35 U.S.C. §119 on Patent Application No. 2007-186815 filed in Japan on Jul. 18, 2007, the entire contents of which are hereby incorporated by reference.

BACKGROUND OF THE INVENTION

The present invention relates to a semiconductor device and a method for fabricating the same, and more particularly, it relates to a semiconductor device including an n-type MIS (metal insulator semiconductor) transistor and a p-type MIS transistor and a method for fabricating the same.

As means for improving the driving performance of a semiconductor device having a MIS structure, not only refinement of a gate length but also improvement of channel mobility by applying a stain technique in a channel region is now being regarded a promising method. As the strain technique to be employed in, for example, an n-type MIS transistor, a method in which a liner film is provided with tensile stress, SMT (stress memorization technique) and the like are being studied. In the SMT, activation annealing is performed with an insulating film, for applying stress to a channel region, deposited on a transistor, so as to utilize the thus obtained residual stress. On the other hand, as the strain technique to be employed in a p-type MIS transistor, a method in which a liner film is provided with compressive stress and a method in which an active region is provided with compressive stress by epitaxially growing a silicon germanium (SiGe) layer selectively on the active region are being studied (see, for example, W. H. Lee et al., "IEDM 2005", pp. 61-64).

In the case where a strain layer of SiGe is formed for providing a p-type MIS transistor alone with compressive stress, the following process is employed:

First, as shown in FIG. 11A, a first gate insulating film 113A, a first gate electrode 114A and a first hard mask 133A of an n-type MIS transistor are formed on a first active region 101A surrounded with an isolation region 112 in a semiconductor substrate 100, and n-type extension diffusion layers 117A are formed in the first active region 101A. Also, a second gate insulating film 113B, a second gate electrode 114B and a second hard mask 133B of a p-type MIS transistor are formed on a second active region 101B surrounded with the isolation region 112, and p-type extension diffusion layers 117B are formed in the second active region 101B. Subsequently, a first sidewall 115A including an insulating film 118A and an insulating film 119A is formed on the side face of the first gate electrode 114A, and a second sidewall 115B including an insulating film 118B and an insulating film 119B is formed on the side face of the second gate electrode 114B.

Next, after depositing an insulating film 135 over the semiconductor substrate 100, a portion of the insulating film 135 deposited in the second region 100B is selectively removed. Thereafter, by using the remaining insulating film 135 as a mask, a recess 100a is formed in an exposed portion of the second active region 101B as shown in FIG. 11B.

Then, as shown in FIG. 11C, a SiGe layer 121 corresponding to a strain layer is epitaxially grown in the recess 100a. Subsequently, after removing the insulating film 135, n-type source/drain diffusion layers are formed, and a silicide layer, a liner film, an interlayer insulating film, a contact, an interconnection and the like are further formed if necessary.

Through this process, a semiconductor device in which compressive stress is applied merely to a p-type MIS transistor can be realized.

The conventional fabrication process for a semiconductor device has, however, the following problems: In order to form a SiGe layer merely in a p-type MIS transistor forming region, it is necessary to form a mask made of an insulating film covering an n-type MIS transistor forming region.

In forming or removing a mask made of an insulating film, it is necessary to perform excessive over-etching so as not to allow the insulating film to remain. Therefore, a sidewall film may be reduced in the thickness or a substrate may be partly removed in forming or removing such a mask. It is difficult to control such unintentional thickness reduction or substrate removal, and hence, the characteristics of semiconductor devices are disadvantageously varied due to the thickness reduction or substrate removal. Also when the insulating film unintentionally remains, it is apprehended that the characteristics may be varied. Furthermore, there arises another problem that the number of procedures is increased because of the formation and removal of the mask.

SUMMARY OF THE INVENTION

An object of the invention is solving the aforementioned conventional problems by realizing a semiconductor device with improved driving performance without increasing the number of procedures and without causing the characteristic variation.

Specifically, the semiconductor device of this invention includes an n-type MIS transistor formed on a first active region of a semiconductor substrate and a p-type MIS transistor formed on a second active region of the semiconductor substrate. The n-type MIS transistor includes a first gate electrode formed on the first active region and a first sidewall formed on a side face of the first gate electrode. The p-type MIS transistor includes a second gate electrode formed on the second active region, a second sidewall formed on a side face of the second gate electrode and strain layers formed in the second active region for applying strain in a channel region of the p-type MIS transistor. The second sidewall has a smaller thickness along a gate length direction than the first sidewall.

According to the semiconductor device of this invention, in forming the strain layers for causing strain in the channel region of the p-type MIS transistor, a sidewall forming film can be used as a mask. Accordingly, there is no need to additionally form a mask, and hence, it is possible to avoid excessive etching of the sidewall and the active region or mask remain in the active region otherwise caused in wholly removing the additional mask. Therefore, a semiconductor device with improved driving performance and minimally varied in the characteristic can be realized. Furthermore, the number of procedures is minimally increased.

The method for fabricating a semiconductor device of this invention is employed for fabricating a semiconductor device including an n-type MIS transistor formed on a first active region of a semiconductor substrate and a p-type MIS transistor formed on a second active region of the semiconductor substrate. The method includes the steps of (a) forming a first gate electrode on the first active region and forming a second gate electrode on the second active region; (b) forming a sidewall forming film on the semiconductor substrate so as to cover the first gate electrode and the second gate electrode; (c) reducing a thickness of the sidewall forming film in a portion thereof disposed on the second active region to be smaller than in a portion thereof disposed on the first active region; (d) etching the sidewall forming film for exposing a part of the second active region with the first active region covered with the sidewall forming film after the step (c); (e) forming a recess by etching the exposed part of the second active region with the sidewall forming film used as a mask and forming a strain layer in the recess after the step (d); and (f) forming a first sidewall on a side face of the first gate electrode and a second sidewall on a side face of the second gate electrode by etching the sidewall forming film until a part of the first active region is exposed after the step (e).

In the method for fabricating a semiconductor device of this invention, as compared with the case where a mask used for forming a recess and for growing crystal of a stain causing layer is separately formed, a procedure for forming the mask and a procedure for wholly removing the mask can be omitted. Therefore, it is possible to avoid excessive etching of the sidewall and the active region otherwise caused in wholly removing the mask. Accordingly, a semiconductor device with improved driving performance and minimally varied in the characteristic can be realized. Furthermore, the number of procedures is minimally increased.

BRIEF DESCRIPTION OF THE DRAWINGS

FIGS. 8A, 8B, 8C and 8D are cross-sectional views for showing procedures in a method for fabricating a semiconductor device according to Embodiment 3 of the invention.

DETAILED DESCRIPTION OF THE INVENTION

Embodiment 1

Figure 1:
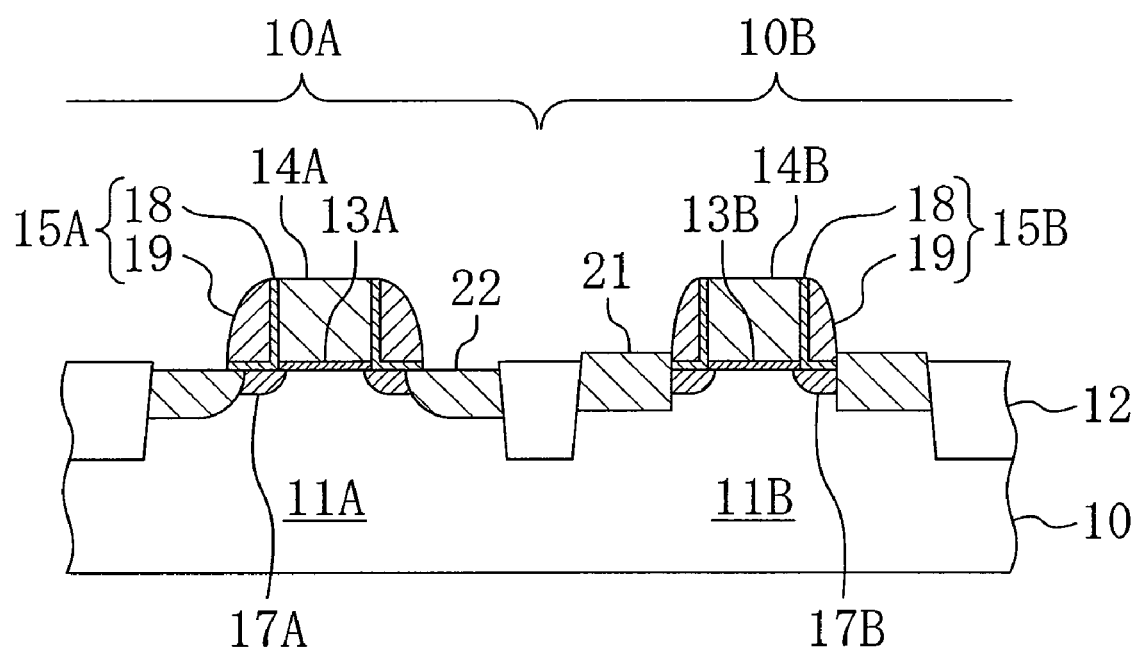
FIG. 1 is a cross-sectional view of a semiconductor device according to Embodiment 1 of the invention.

FIG. 1 shows the cross-sectional structure of a semiconductor device according to Embodiment 1 of the invention. As shown in FIG. 1, the semiconductor device of this embodiment includes an n-type MIS transistor corresponding to a first transistor formed in a first region 10A of a semiconductor substrate 10 of silicon (Si) and a p-type MIS transistor corresponding to a second transistor formed in a second region 10B.

The first region 10A includes a first active region 11A surrounded with an isolation region 12 formed in the semiconductor substrate, and the second region 10B includes a second active region 11B surrounded with the isolation region 12.

A first gate electrode 14A is formed above the first active region 11A with a first gate insulating film 13A sandwiched therebetween, and a first sidewall 15A is formed on the side face of the first gate electrode 14A. A second gate electrode 14B is formed above the second active region 11B with a second gate insulating film 13B sandwiched therebetween, and a second sidewall 15B is formed on the side face of the second gate electrode 14B.

Each of the first gate insulating film 13A and the second gate insulating film 13B is made of silicon oxide ($SiO_2$) or the like, and each of the first gate electrode 14A and the second gate electrode 14B is made of polysilicon or the like including an impurity. Each of the first sidewall 15A and the second sidewall 15B includes a first insulating film 18 with an L-shaped cross-section and a second insulating film 19 covering the first insulating film 18. The second insulating film 19 is made of, for example, silicon nitride (SiN) and the first insulating film 18 is made of, for example, $SiO_2$.

N-type extension diffusion layers 17A are formed in portions of the first active region 11A disposed on both sides of the first gate electrode 14A. N-type source/drain diffusion layers 11 with a larger depth than the n-type extension diffusion layers 17A are formed in portion of the first active region 11A disposed outside the first sidewall 15A.

P-type extension diffusion layers 17B are formed in portions of the second active region 11B disposed on both sides of the second gate electrode 14B. Strain layers 21 are formed in portions of the second active region 11B disposed outside the second sidewall 15B. Each strain layer 21 is a silicon germanium (SiGe) layer formed by epitaxially growing SiGe in a recess formed in a portion of the second active region 11B outside the second sidewall 15B. This strain layer 21 applies compressive stress along a gate length direction to a channel region of the p-type MIS transistor.

Since the strain layers are formed merely in the second active region 11B where the p-type MIS transistor is formed in the semiconductor device of this embodiment, the compressive stress can be effectively applied to the p-type MIS transistor alone, and therefore, the driving performance of the p-type MIS transistor can be improved without degrading the driving performance of the n-type MIS transistor.

Furthermore, in the semiconductor device of this embodiment, a sidewall forming film used for forming the sidewall is used as a mask for forming the recess and as a mask for growing the crystal of the SiGe layer as described below. Therefore, characteristic variation caused in forming and removing a mask can be substantially avoided. Furthermore, the number of procedures is minimally increased. It is noted that the thickness along the gate length direction of the second sidewall 15B is smaller than the thickness along the gate length direction of the first sidewall 15A.

Now, a method for fabricating a semiconductor device according to Embodiment 1 of the invention will be described with reference to the accompanying drawings. FIGS. 2A through 2C, 3A through 3C and 4A through 4C are cross-sectional views for showing procedures in the method for fabricating a semiconductor device of this embodiment.

Figure 2A:
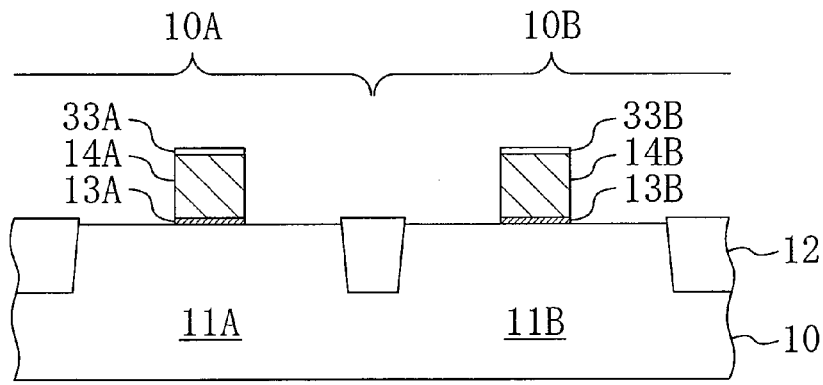
FIGS. 2A, 2B and 2C are cross-sectional views for showing procedures in a method for fabricating a semiconductor device according to Embodiment 1 of the invention.

First, on a semiconductor substrate 10 having a first region 10A and a second region 10B, a gate insulating forming film with a thickness of 2.2 nm, a polysilicon film with a thickness of 120 nm and a hard mask forming film of SiO$_2$ or the like with a thickness of 20 nm are successively deposited. Subsequently, as shown in FIG. 2A, the deposited films are patterned by lithography and dry etching. Thus, a first gate insulating film 13A, a first gate electrode 14A and a first hard mask 33A are formed on a first active region 11A isolated by an isolation region 12 in the first region 10A. Also, a second gate insulating film 13B, a second gate electrode 14B and a second hard mask 33B are formed on a second active region 11B isolated by the isolation region 12 in the second region 10B.

A gate insulating forming film is made of a general material for a gate insulating film such as a silicon oxide film, a silicon oxy-nitride film, a silicon nitride film or a high dielectric film and is preferably made of a silicon oxy-nitride film into which nitrogen is introduced. Alternatively, in order to reduce the effective thickness, a multilayered film of a silicon oxy-nitride film and a high dielectric film may be used. Alternatively, a polysilicon film into which an impurity has been previously introduced for providing a conducting property may be used.

Figure 2B:
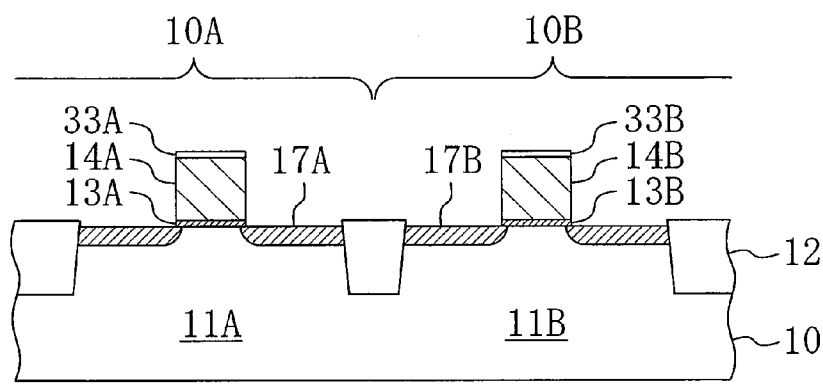

Next, after forming a resist mask covering the second region 10B, arsenic (As) is implanted into the first active region 11A with an accelerating voltage of 3 keV and a dose of $1 \times 10^{15}$ cm$^{-2}$. Also, after forming a resist mask covering the first region 10A, boron (B) is implanted into the second active region 11B with an accelerating voltage of 0.3 keV and a dose of $4 \times 10^{14}$ cm$^{-2}$. Thus, n-type extension diffusion layers 17A are formed in portions of the first active region 11A disposed on both sides of the first gate electrode 14A and p-type extension diffusion layers 17B are formed in portions of the second active region 11B on both sides of the second gate electrode 14B as shown in FIG. 2B.

Figure 2C:
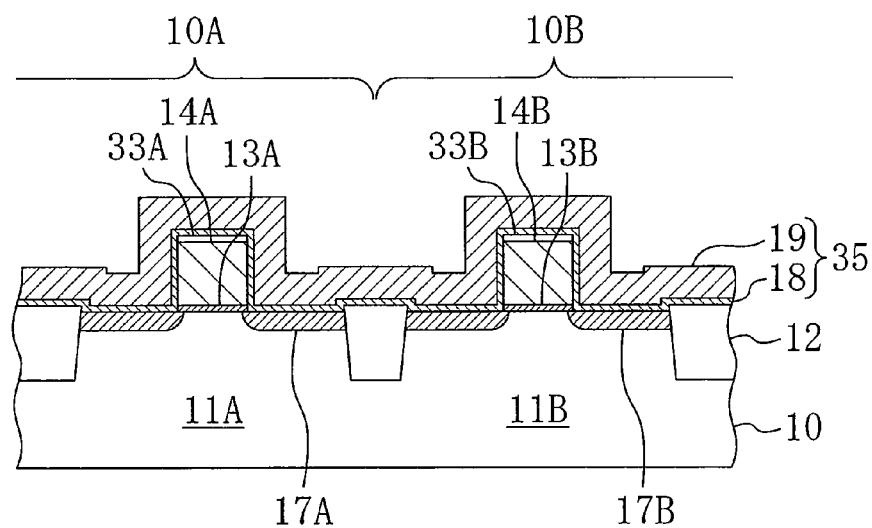

Next, as shown in FIG. 2C, a sidewall forming film 35 is formed on the semiconductor substrate 10 so as to cover the first gate electrode 14A and the second gate electrode 14B. In this embodiment, the sidewall forming film 35 is composed of a first insulating film 18 of SiO$_2$ with a thickness of 10 nm and a second insulating film 19 of SiN with a thickness of 40 nm formed on the first insulating film 18.

Figure 3A:
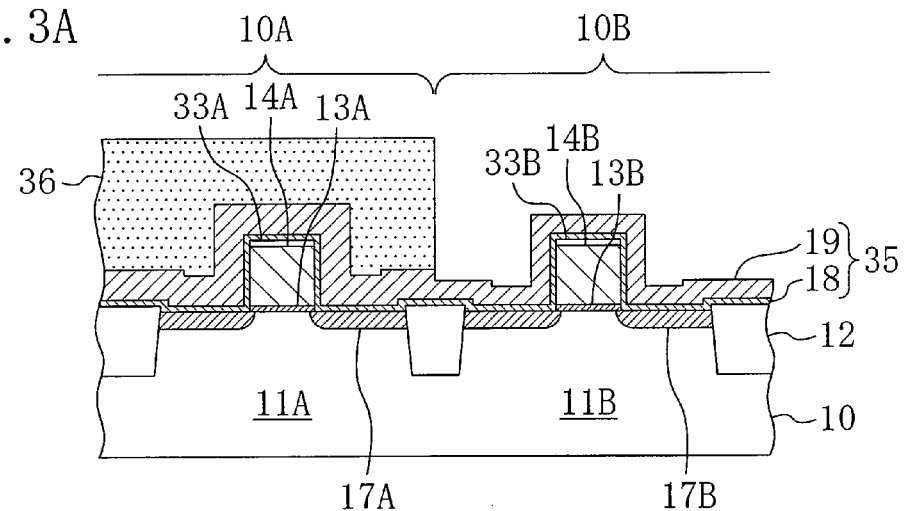
FIGS. 3A, 3B and 3C are cross-sectional views for showing other procedures in the method for fabricating a semiconductor device according to Embodiment 1 of the invention.

Then, as shown in FIG. 3A, after forming a resist mask 36 covering the first region 10A, isotropic dry etching is performed until the thickness of a portion of the sidewall forming film 35 disposed in the second region 10B is reduced to approximately 30 nm. Herein, the second insulating film 19 is etched by 20 nm, so as to attain a total thickness of 30 nm of the first insulating film 18 (with a thickness of 10 nm) and the etched second insulating film 19 (with a thickness of 20 nm).

Figure 3B:
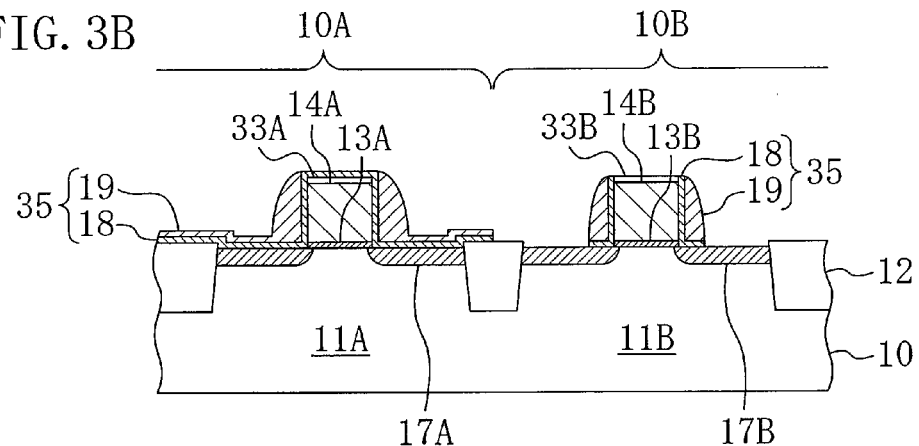

Next, as shown in FIG. 3B, after removing the resist mask 36, the sidewall forming film 35 is etched until the surfaces of source/drain forming portions of the second active region 11B are exposed. At this point, the sidewall forming film 35 has a larger thickness by approximately 20 nm in a portion thereof disposed in the first region 10A than in a portion thereof disposed in the second region 10B. Therefore, the sidewall forming film 35 remains above the first active region 11A in the first region 10A. Accordingly, the surfaces of source/drain forming portions of the first active region 11A are not exposed.

Figure 3C:
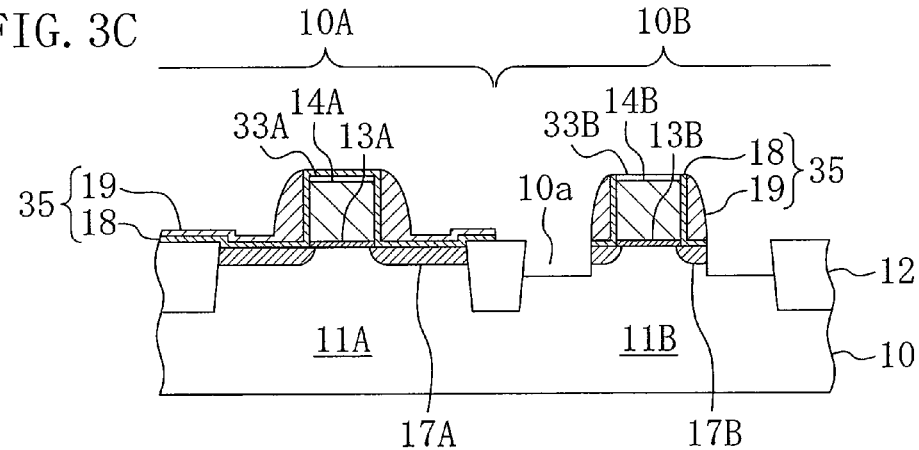

Then, as shown in FIG. 3C, recesses 10a are formed by etching the exposed portions of the second active region 11B. Each recess 10a has a depth of 50 nm.

Figure 4A:
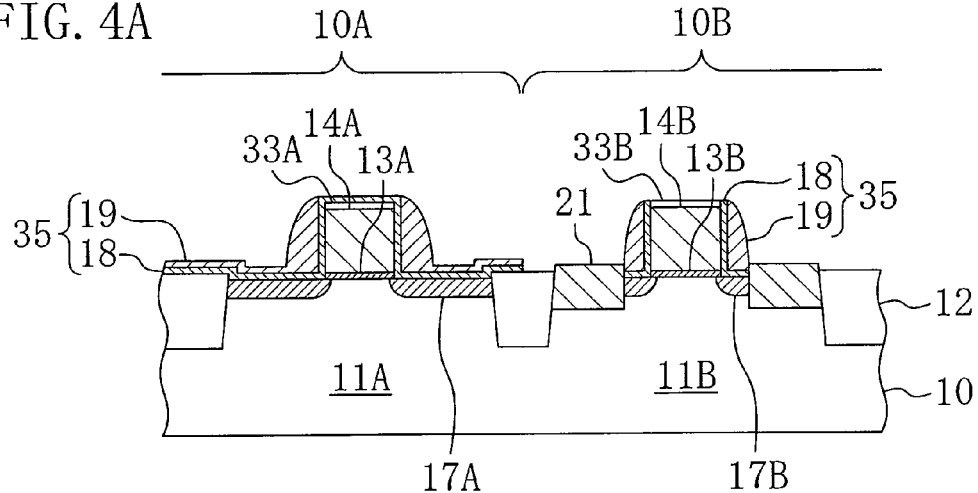
FIGS. 4A, 4B and 4C are cross-sectional views for showing other procedures in the method for fabricating a semiconductor device according to Embodiment 1 of the invention.

Thereafter, as shown in FIG. 4A, SiGe is epitaxially grown and filled in each recess 10a so as to form a strain layer 21 with a thickness of 80 nm.

Figure 4B:
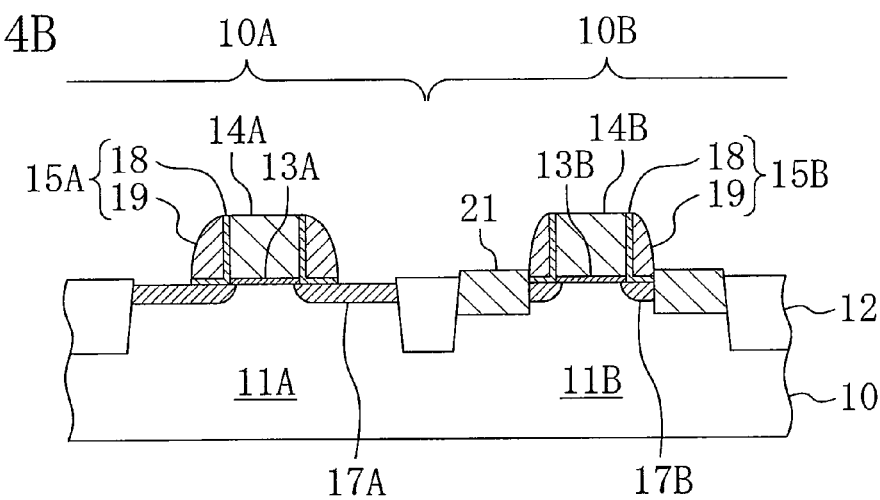

Next, as shown in FIG. 4B, the sidewall forming film 35 is etched again, so as to expose the source/drain forming portions of the first active region 11A. Thereafter, the first hard mask 33A and the second hard mask 33B are removed. Thus, a first sidewall 15A covering the side face of the first gate insulating film 14A and a second sidewall 15B covering the side face of the second gate electrode 14B are formed. Since the thickness of the sidewall forming film 35 is reduced in the second region 10B in the procedure shown in FIG. 3A, the thickness along the gate length of the second sidewall 15B is smaller than that of the first sidewall 15A.

Figure 4C:
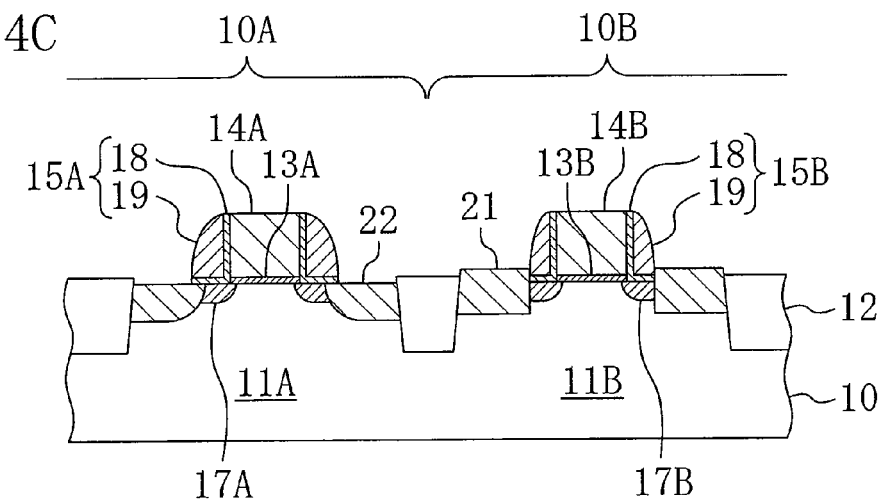

Next, after forming a resist mask covering the second region 10B, As is implanted into the first active region 11A with an accelerating voltage of 15 keV and a dose of $4 \times 10^{15}$ cm$^{-2}$. Thus, n-type source/drain diffusion layers 22 are formed in portions of the first active region 11A disposed outside the first sidewall 15A as shown in FIG. 4C.

Thereafter, a silicide layer, a liner insulating film, an interlayer insulating film, a contact, an interconnection and the like may be formed if necessary. For example, when a liner insulating film made of a silicon nitride film for applying tensile stress along the gate length direction to the channel region is formed above the first active region 11A of the first region 10A, the driving performance of the n-type MIS transistor can be improved.

In the method for fabricating a semiconductor device of Embodiment 1, the sidewall forming film 35 is used as a mask used for forming the recesses 10a and as a mask used for epitaxially growing SiGe as the strain layers 21. Therefore, there is no procedure for separately forming and removing a mask used for forming the strain layers 21, and hence, the semiconductor substrate, the isolation region, the sidewall and the like are never excessively over-etched in the first region.

In the case where a sidewall is excessively over-etched, it is apprehended that a short channel effect (SCE) may be caused. When the thickness of a sidewall is, for example, reduced from 40 nm to 30 nm through the over-etching, it is apprehended that a threshold voltage change ΔVt corresponding to an index of the SCE may be increased by 20 mV or more in a transistor with a gate length Lg of 40/34 nm (typ/min.).

Moreover, it is apprehended that unexpected thickness reduction may be caused in an active region and an isolation region through the excessive over-etching or that a film to be etched may remain for avoiding the excessive over-etching. These phenomenon can be a factor to vary the characteristics of semiconductor devices.

In the fabrication method of this embodiment, however, the first sidewall 15A and the first active region 11A are never subjected to the excessive over-etching, and there is no fear of unexpected thickness reduction otherwise caused by removing a whole mask. Furthermore, the number of procedures is minimally increased.

In the method for fabricating a semiconductor device of this embodiment, the thickness of the second sidewall 15B of the p-type MIS transistor is smaller than the thickness of the first sidewall 15A. However, the SCE of the p-type MIS transistor is never degraded and the second active region 11B is never excessively etched due to this smaller thickness.

Although the sidewall forming film is a two-layered structure including the second insulating film of SiO$_2$ and the first insulating film of SiN in this embodiment, it may be made of a single-layered film. However, when the second insulating film is made of the same material as the hard mask, the first and second hard masks can be simultaneously removed as the sidewall forming film 35 and hence the occurrence of the over-etching can be further reduced.

Embodiment 2

Embodiment 2 of the invention will now be described with reference to the accompanying drawings. FIGS. 5A through 5D, 6A through 6C and 7A through 7C are cross-sectional views for showing procedures in a method for fabricating a semiconductor device according to Embodiment 2. The structure of the semiconductor device of Embodiment 2 is the same as that of Embodiment 1 and hence the description is omitted. Also, like reference numerals are used in FIGS. 5A through 5D, 6A through 6C and 7A through 7C to refer to like elements shown in FIGS. 2A through 2C, 3A through 3C and 4A through 4C so as to omit the description.

Figure 5A:
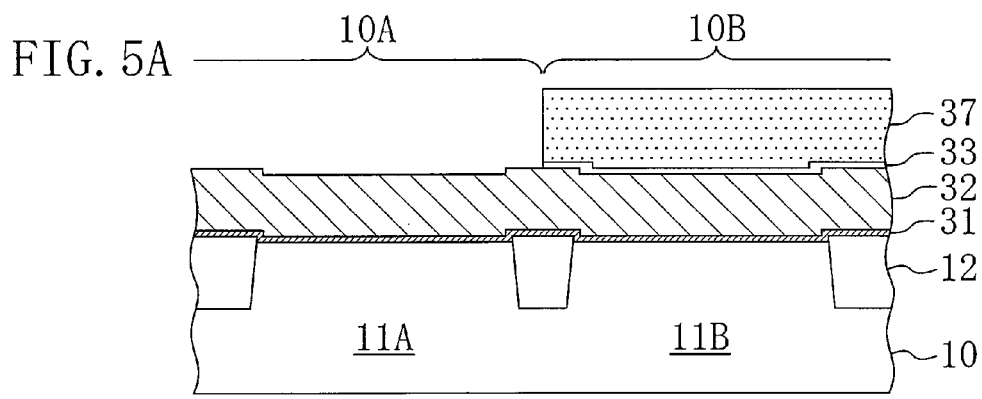
FIGS. 5A, 5B, 5C and 5D are cross-sectional views for showing procedures in a method for fabricating a semiconductor device according to Embodiment 2 of the invention.

First, in the same manner as in Embodiment 1, a gate insulating forming film 31 with a thickness of 2.2 μm, a polysilicon film 32 with a thickness of 120 nm and a hard mask forming film 33 of $SiO_2$ with a thickness of 20 nm are successively deposited on a semiconductor substrate 10 having a first region 10A and a second region 10B. Subsequently, as shown in FIG. 5A, after forming a resist mask 37 covering the second region 10B, a portion of the hard mask forming film 33 formed in the first region 10A is removed through etching.

Figure 5B:
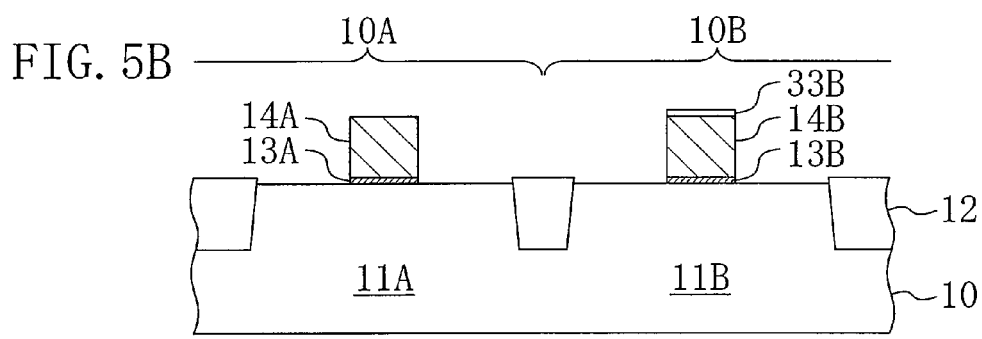

Next, as shown in FIG. 5B, the deposited films are patterned by the lithography and the dry etching. Thus, a first gate insulating film 13A and a first gate electrode 14A are formed on a first active region 11A isolated by an isolation region 12 in the first region 10A. Also, a second gate insulating film 13B, a second gate electrode 14B and a second hard mask 33B are formed on a second active region 11B isolated by the isolation region 12 in the second region 10B.

Figure 5C:
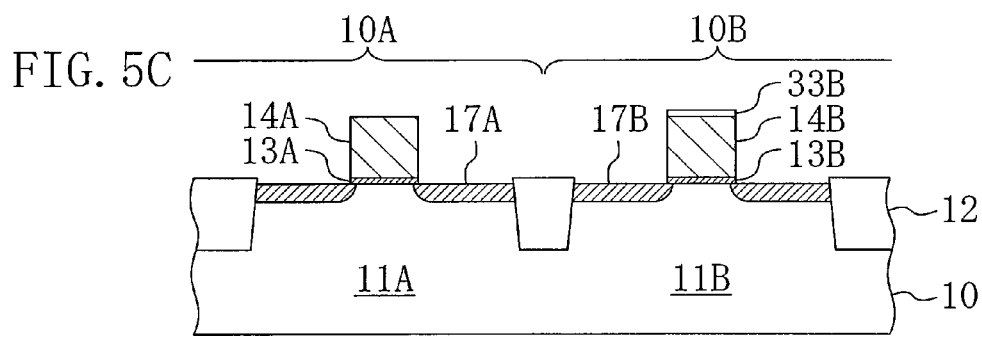

Then, after forming a resist mask covering the second region 10B, As is implanted into the first active region 11A with an accelerating voltage of 3 keV and a dose of $1\times10^{15}$ $cm^{-2}$. Furthermore, after forming a resist mask covering the first region 10A, B is implanted into the second active region 11B with an accelerating voltage of 0.3 keV and a dose of $4\times10^{14}$ $cm^{-2}$. Thus, n-type extension diffusion layers 17A are formed in portions of the first active region 11A disposed on both sides of the first gate electrode 14A and p-type extension diffusion layers 17B are formed in portions of the second active region 11B disposed on both sides of the second gate electrode 14B as shown in FIG. 5C.

Figure 5D:
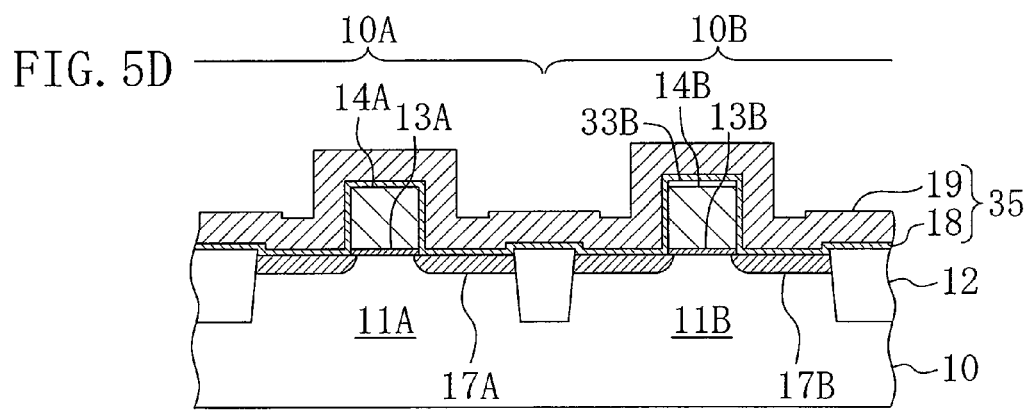

Next, as shown in FIG. 5D, a sidewall forming film 35 is formed on the semiconductor substrate 10 so as to cover the first gate electrode 14A and the second gate electrode 14B. In this embodiment, the sidewall forming film 35 is a multilayered film of a first insulating film 18 of $SiO_2$ with a thickness of 10 nm and a second insulating film 19 of SiN with a thickness of 40 nm formed on the first insulating film 18.

Figure 6A:
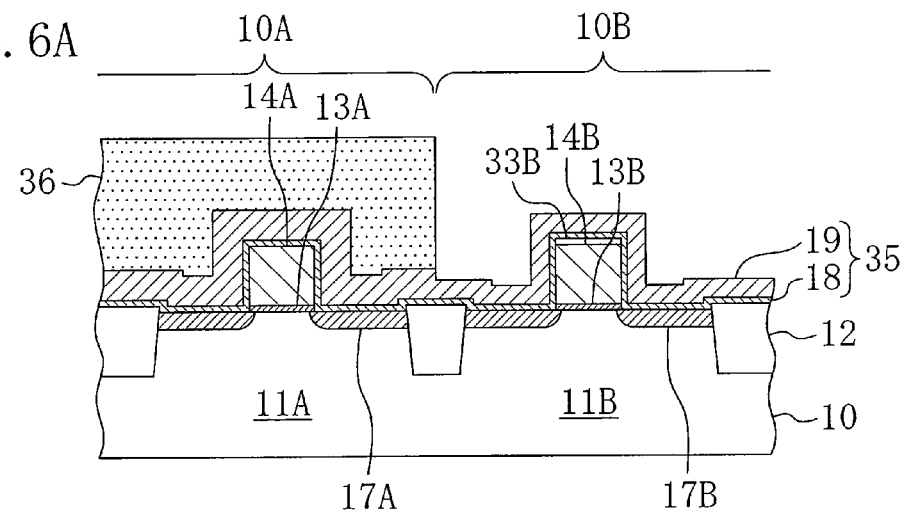
FIGS. 6A, 6B and 6C are cross-sectional views for showing other procedures in the method for fabricating a semiconductor device according to Embodiment 2 of the invention.

Then, as shown in FIG. 6A, after forming a resist mask 36 covering the first region 10A, the isotropic dry etching is performed until the thickness of a portion of the sidewall forming film 35 disposed in the second region 10B is reduced to approximately 30 nm. At this point, the second insulating film 19 is etched by 20 nm, so as to attain a total thickness of 30 nm of the first insulating film 18 (with a thickness of 10 nm) and the etched second insulating film 19 (with a thickness of 20 nm).

Figure 6B:
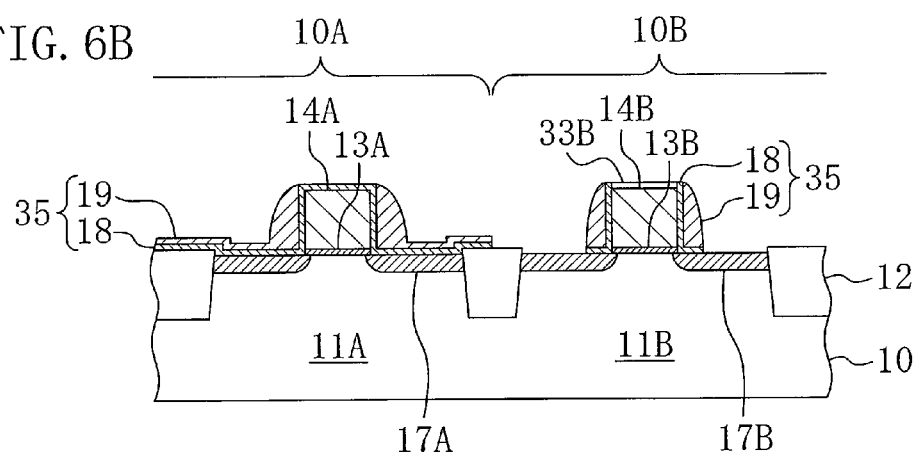

Next, as shown in FIG. 6B, after removing the resist mask 36, the sidewall forming film 35 is etched until the surfaces of source/drain forming portions of the second active region 11B are exposed. The sidewall forming film 35 has a larger thickness by approximately 20 nm in a portion thereof disposed in the first region 10A than in a portion thereof disposed in the second region 10B. Therefore, the sidewall forming film 35 remains above the first active region 11A in the first region 10A. Accordingly, the surfaces of source/drain forming portions of the first active region 11A are not exposed.

Figure 6C:
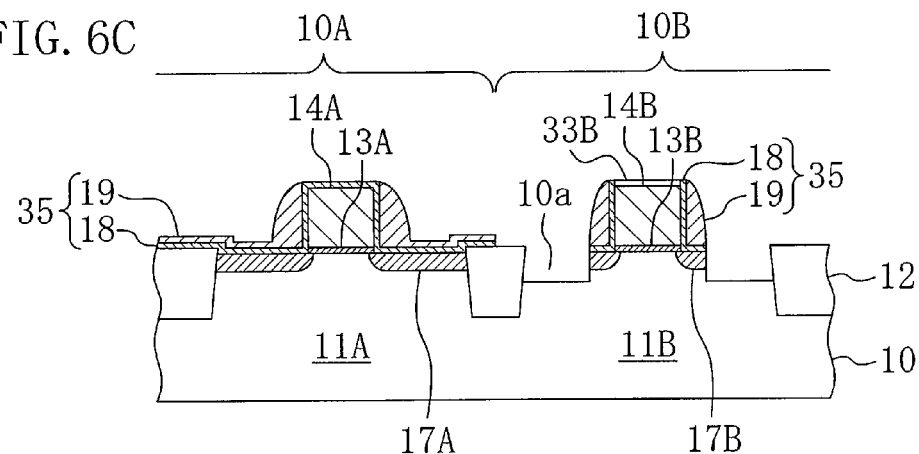

Then, as shown in FIG. 6C, the exposed portions of the second active region 11B are etched so as to form recesses 10a. Each recess 10a has a depth of 50 nm.

Figure 7A:
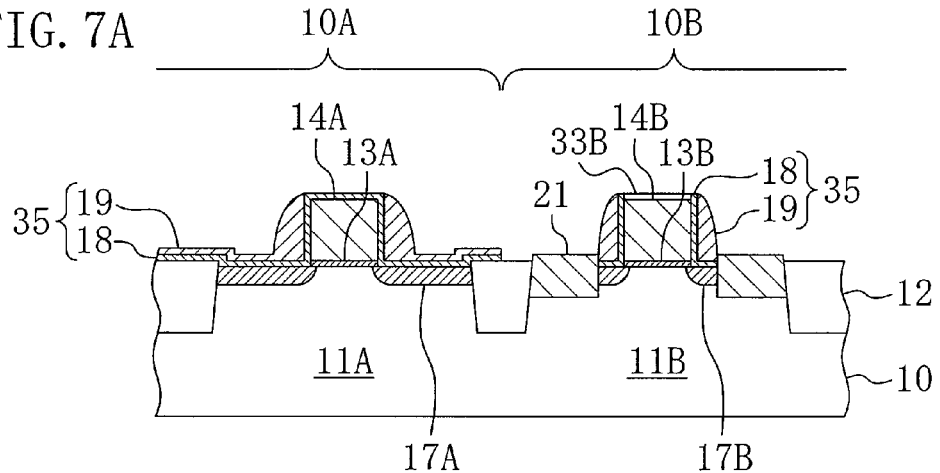
FIGS. 7A, 7B and 7C are cross-sectional views for showing other procedures in the method for fabricating a semiconductor device according to Embodiment 2 of the invention.

Next, as shown in FIG. 7A, SiGe is epitaxially grown and filled in each recess 10a so as to from a strain layer 21 with a thickness of 80 nm.

Figure 7B:
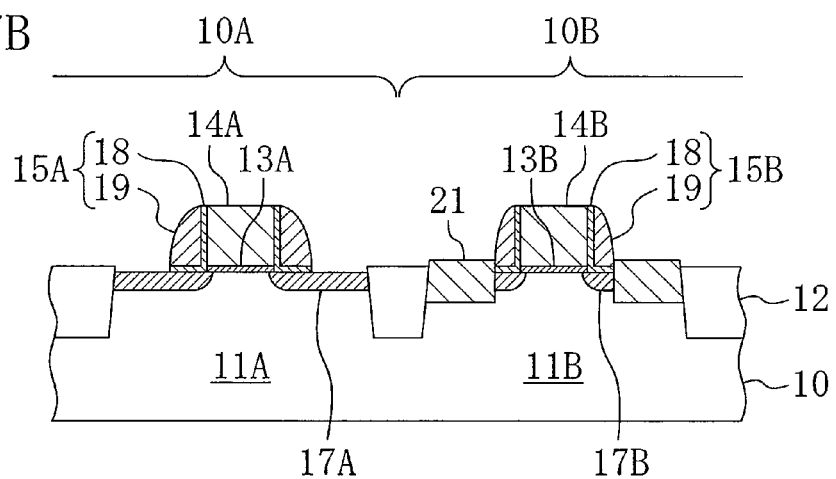

Thereafter, as shown in FIG. 7B, the sidewall forming film 35 is etched again, so as to expose the surfaces of the source/drain forming portions of the first active region 11A. Also, the second hard mask 33B is removed. Thus, a first sidewall 15A covering the side face of the first gate electrode 14A and a second sidewall 15B covering the side face of the second gate electrode 14B are formed.

Figure 7C:
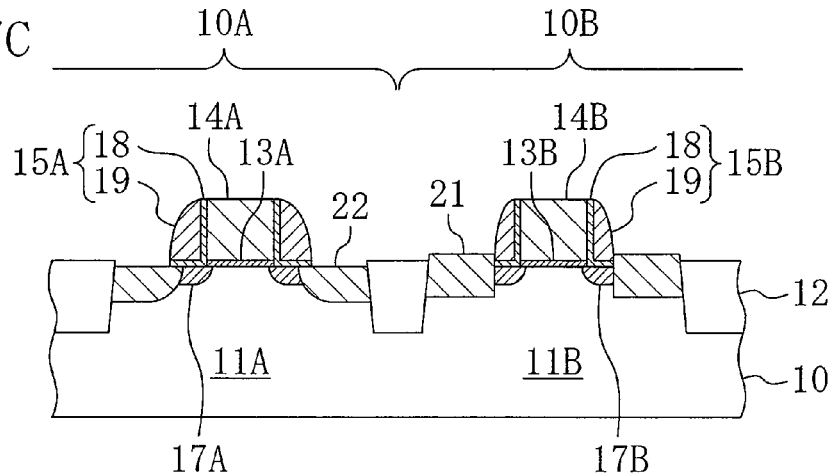

Next, after forming a resist mask covering the second region 10B, As is implanted into the first active region 11A with an accelerating voltage of 15 keV and a dose of $4\times10^{15}$ $cm^{-2}$. Thus, n-type source/drain diffusion layers 22 are formed in portions of the first active region 11A disposed outside the first sidewall 15A as shown in FIG. 7C.

Thereafter, a silicide layer, a liner insulating film, an interlayer insulating film, a contact, an interconnection and the like are formed if necessary. For example, when a liner insulating film made of a silicon nitride film for applying tensile stress along the gate length direction to a channel region is formed above the first active region 11A in the first region 10A, the driving performance of the n-type MIS transistor can be improved.

In the method for fabricating a semiconductor device of Embodiment 2, a first hard mask covering the top face of the first gate electrode 14A is not formed. Therefore, before forming the first sidewall 15A and the second sidewall 15B, the insulating film (the first insulating film 18) covering the first gate electrode 14A and the insulating film (the second hard mask 33B) covering the second gate electrode 14B have substantially the same thickness as shown in FIG. 7A. Furthermore, the insulating film covering the first gate electrode 14A and the insulating film covering the first active region 11A have substantially the same thickness.

Therefore, as compared with the case where a first hard mask and a sidewall forming film are both formed on the first gate electrode 14A, the fear of the over-etching of the second gate electrode 14B and the first active region 11A can be further reduced. As a result, in addition to the effects attained by the method for fabricating a semiconductor device of Embodiment 1, an effect to further reduce the occurrence of the short channel effect and the occurrence of the characteristic variation can be attained.

Although the sidewall forming film is a two-layered structure of the second insulating film of $SiO_2$ and the first insulating film of SiN in this embodiment, the sidewall forming film may be a single-layered film. However, the second insulating film is preferably made of the same material as the hard mask. Alternatively, in the case where the second insulating film is made of a different material from the hard mask, the thickness of the hard mask is preferably determined so as to make the same the etching time of the second insulating film and the etching time of the hard mask in consideration of their etching rates.

In this embodiment, the hard mask forming film formed in the first region is removed before patterning the first gate electrode so as not to form a first hard mask. Instead, a first hard mask may be formed and removed before forming the sidewall forming film. However, when the hard mask forming film is removed before patterning the hard mask forming film as in this embodiment, the active layer is never damaged by the etching.

Embodiment 3

Embodiment 3 of the invention will now be described with reference to the accompanying drawings. FIGS. 8A through 8D, 9A through 9D and 10A through 10C are cross-sectional views for showing procedures in a method for fabricating a semiconductor device according to Embodiment 3. Like reference numerals are used in FIGS. 8A through 8D, 9A through 9D and 10A through 10C to refer to like elements shown in FIGS. 2A through 2C, 3A through 3C and 4A through 4C so as to omit the description.

First, a gate insulating forming film with a thickness of 2.2 nm, a polysilicon film with a thickness of 120 nm and a hard mask forming film of $SiO_2$ with a thickness of 20 nm are successively deposited on a semiconductor substrate 10 having a first region 10A and a second region 10B. Subsequently, as shown in FIG. 8A, the deposited films are patterned by the lithography and the dry etching. Thus, a first gate insulating film 13A, a first gate electrode 14A and a first hard mask 33A are formed on a first active region 11A isolated by an isolation region 12 in the first region 10A. Also, a second gate insulating film 13B, a second gate electrode 14B and a second hard mask 33B are formed on a second active region 11B isolated by the isolation region 12 in the second region 10B.

Next, as shown in FIG. 8B, a sidewall forming film 35 is formed on the semiconductor substrate 10 so as to cover the first gate electrode 14A and the second gate electrode 14B. In this embodiment, the sidewall forming film 35 is a $SiO_2$ film with a thickness of 40 nm.

Then, as shown in FIG. 8C, after forming a resist mask 36 covering the first region 10A, the sidewall forming film 35 is wet etched until the thickness of a portion thereof disposed in the second region 10B is reduced to approximately 20 nm. It is noted that the isotropic dry etching may be employed instead of the wet etching.

Next, as shown in FIG. 8D, after removing the resist mask 36, the sidewall forming film 35 is etched until the surfaces of source/drain forming portions of the second active region 11B are exposed. The sidewall forming film 35 has a larger thickness by approximately 20 nm in a portion thereof disposed in the first region 10A than in a portion thereof disposed in the second region 10B. Therefore, the sidewall forming film 35 remains above the first active region 11A in the first region 10A. Accordingly, the surfaces of source/drain forming portions of the first active region 11A are not exposed.

Figure 9A:
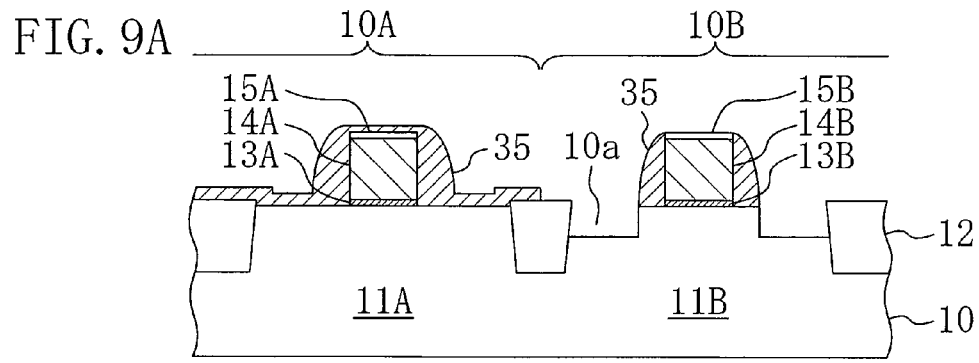
FIGS. 9A, 9B, 9C and 9D are cross-sectional views for showing other procedures in the method for fabricating a semiconductor device according to Embodiment 3 of the invention.

Next, as shown in FIG. 9A, the exposed portions of the second active region 11B are etched so as to form recesses 10a. Each recess 10a has a depth of 50 nm.

Figure 9B:
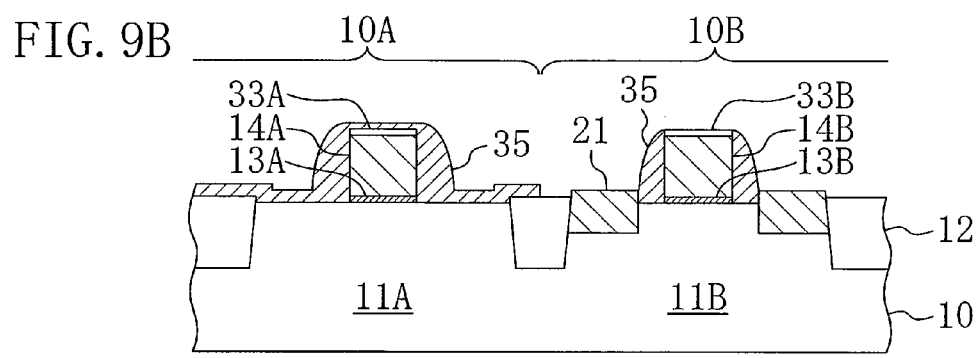

Then, as shown in FIG. 9B, SiGe is epitaxially grown and filled in each recess 10a so as to form a strain layer 21 with a thickness of 80 nm.

Figure 9C:
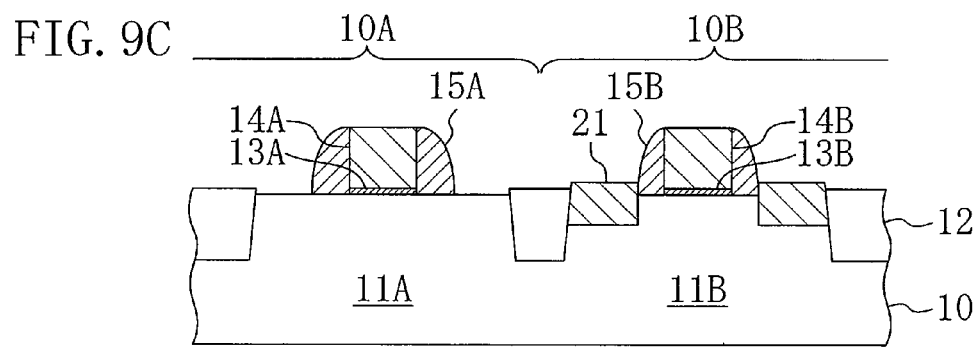

Next, as shown in FIG. 9C, the sidewall forming film 35 is etched again, so as to expose the surfaces of the source/drain forming portions of the first active region 11A. Thereafter, the first hard mask 33A and the second hard mask 33B are removed. Thus, a first sidewall 15A covering the side face of the first gate electrode 14A and a second sidewall 15B covering the side face of the second gate electrode 14B are formed.

Figure 9D:
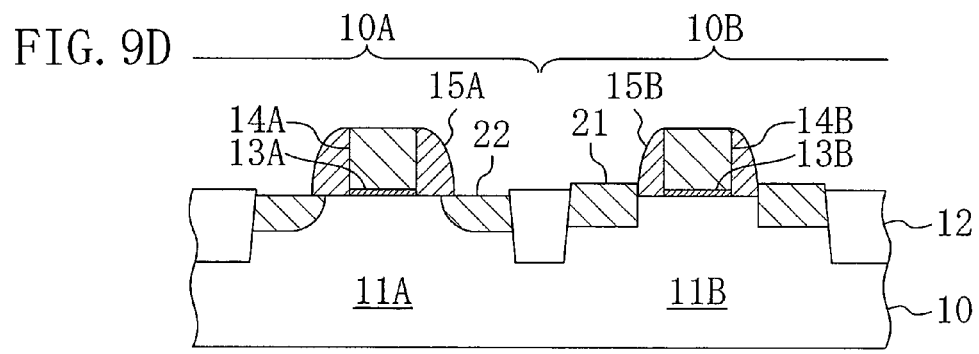

Then, after forming a resist mask covering the second region 10B, As is implanted into the first active region 11A with an accelerating voltage of 15 keV and a dose of $4\times10^{15}$ $cm^{-2}$. Thus, n-type source/drain diffusion layers 22 are formed in portions of the first active region 11A disposed outside the sidewall 15A as shown in FIG. 9D.

Figure 10A:
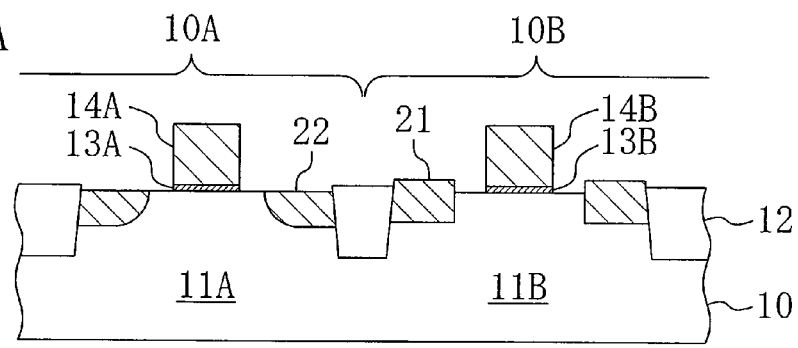
FIGS. 10A, 10B and 10C are cross-sectional views for showing other procedures in the method for fabricating a semiconductor device according to Embodiment 3 of the invention.

Next, as shown in FIG. 10A, the first sidewall 15A and the second sidewall 15B are removed.

Figure 10B:
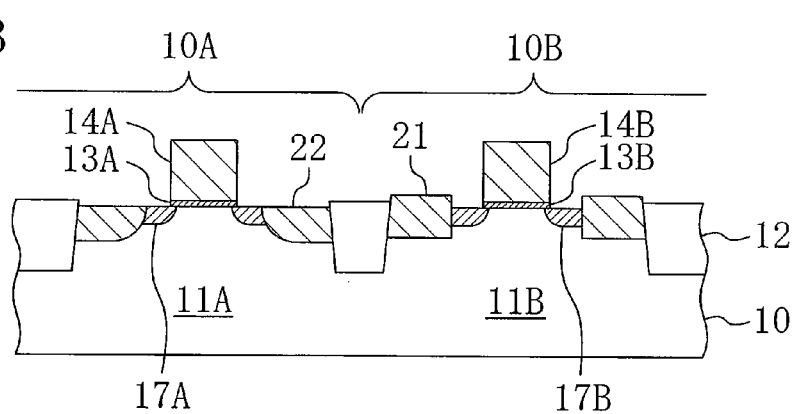

Then, after forming a resist mask covering the second region 10B, As is implanted into the first active region 11A with an accelerating voltage of 3 keV and a dose of $1\times10^{15}$ $cm^{-2}$. Also, after forming a resist mask covering the first region 11A, B is implanted into the second active region 11B with an accelerating voltage of 0.3 keV and a dose of $4\times10^{14}$ $cm^{-2}$. Thus, n-type extension diffusion layers 17A are formed in portions of the first active region 11A disposed on both sides of the first gate electrode 14A and p-type extension diffusion layers 17B are formed in portions of the second active region 11B disposed on both sides of the second gate electrode 14B as shown in FIG. 10B.

Figure 10C:
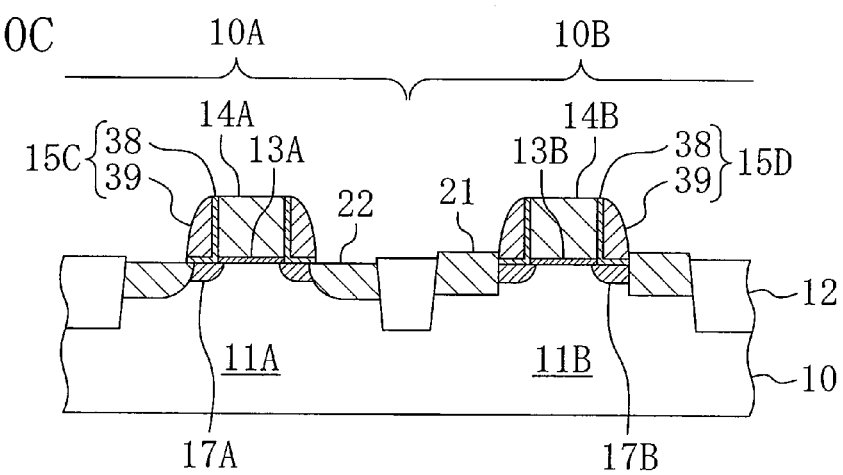
Figure 11A:
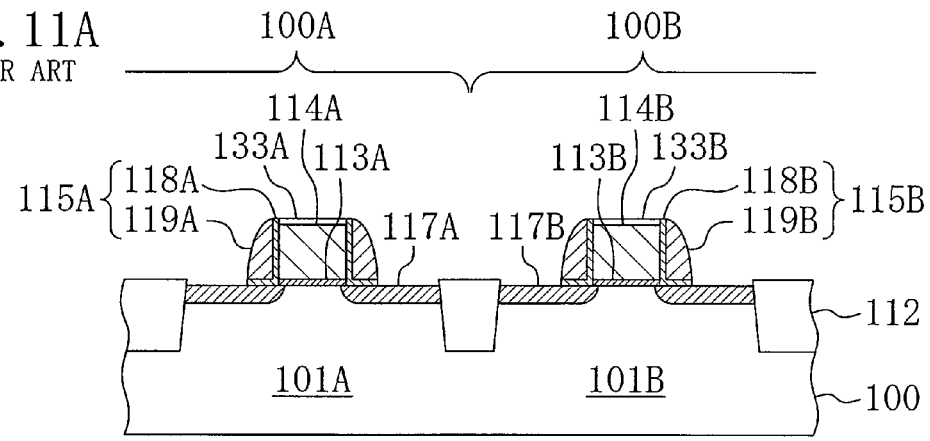
FIGS. 11A, 11B and 11C are cross-sectional views for showing procedures in a conventional method for fabricating a semiconductor device.
Figure 11B:
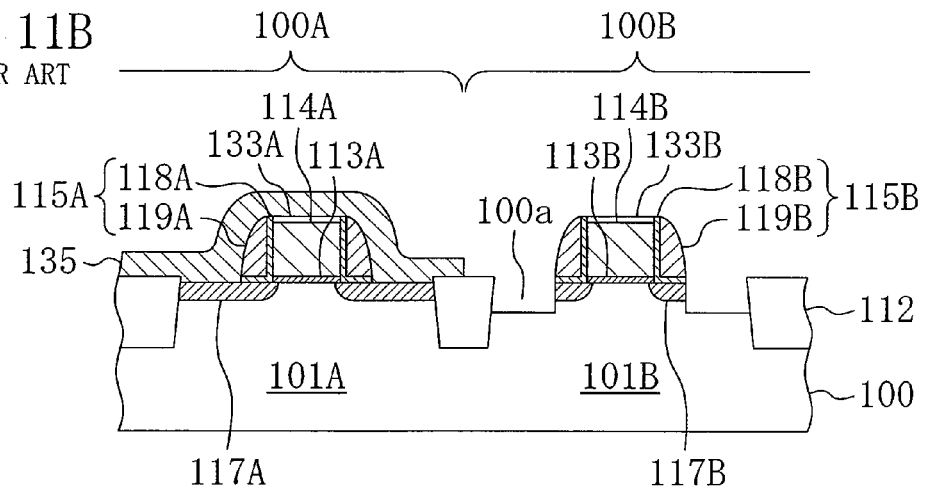
Figure 11C:
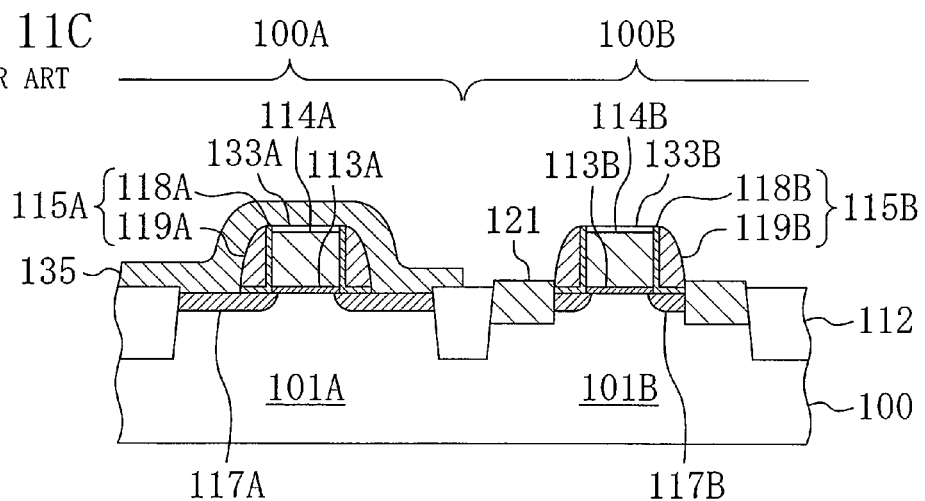

Next, as shown in FIG. 10C, a third sidewall 15C and a fourth sidewall 15D are formed respectively on the side faces of the first gate electrode 14A and the second gate electrode 14B. In this embodiment, each of the third sidewall 15C and the fourth sidewall 15D is made of a multilayered film of a $SiO_2$ film 38 with a thickness of 10 nm and a SiN film 39 with a thickness of 40 nm.

Thereafter, a silicide layer, a liner insulating film, an interlayer insulating film, a contact, an interconnection and the like are formed if necessary. For example, when a liner insulating film made of a silicon nitride film for applying tensile stress along the gate length direction to a channel region is formed above the first active region 11A in the first region 10A, the driving performance of the n-type MIS transistor can be improved.

In the method for fabricating a semiconductor device of this embodiment, since the extension diffusion layers are formed after the source/drain diffusion layers, an effect to realize a profile with low resistance and shallow junction can be attained in addition to the effects attained by the method for fabricating a semiconductor device of Embodiment 1.

Although the sidewall forming film 35 is made of a $SiO_2$ film in this embodiment, a SiN film, a multilayered film of $SiO_2$ and SiN or another insulating film may be used instead. Furthermore, each of the third sidewall 15C and the fourth sidewall 15D may be made of a single-layered film of SiN or the like instead of the multilayered film of the $SiO_2$ film and the SiN film.

Moreover, the first hard mask 33A may be omitted as in Embodiment 2, or the first hard mask 33A may be removed before forming the sidewall forming film 35.

As described so far, according to the semiconductor device and the method for fabricating the same of this invention, a semiconductor device with improved driving performance can be realized without increasing the number of fabrication procedures and without causing characteristic variation, and hence, the invention is useful particularly for a semiconductor device including an n-type MIS transistor and a p-type MIS transistor and a method for fabricating the same.

The description of the embodiments of the present invention is given above for the understanding of the present invention. It will be understood that the invention is not limited to the particular embodiments described herein, but is capable of various modifications, rearrangements and substitutions as will now become apparent to those skilled in the art without departing from the scope of the invention. Therefore, it is intended that the following claims cover all such modifications and changes as fall within the true spirit and scope of the invention.

What is claimed is:

1. A semiconductor device comprising:
an n-type MIS transistor formed on a first active region of a semiconductor substrate and including a first gate electrode formed on the first active region and a first sidewall formed on a side face of the first gate electrode; and
a p-type MIS transistor formed on a second active region of the semiconductor substrate and including a second gate electrode formed on the second active region, a second sidewall formed on a side face of the second gate electrode and having a smaller thickness along a gate length direction than the first sidewall, and strain layers formed in the second active region for applying strain in a channel region of the p-type MIS transistor.

2. The semiconductor device of claim 1, wherein the number of layers included in the first sidewall is equal to the number of layers included in the second sidewall.

3. The semiconductor device of claim 1,
wherein the second active region has recesses on both sides of the second gate electrode, and
the strain layers are silicon germanium layers formed and filled in the recesses.

4. The semiconductor device of claim 1, wherein each of the first sidewall and the second sidewall includes a first insulating film having an L-shaped cross-section and a second insulating film formed over the first insulating film.

5. The semiconductor device of claim 1,
wherein the n-type MIS transistor further includes n-type extension diffusion layers formed in portions of the first active region disposed on both sides of the first gate electrode, and n-type source/drain regions formed in portions of the first active region disposed outside the first sidewall,
the p-type MIS transistor further includes p-type extension diffusion layers formed in portions of the second active region disposed on both sides of the second gate electrode, and
the strain layers are formed outside the p-type extension diffusion layers farther from the channel region and have a larger depth than the p-type extension diffusion layers.

6. A method for fabricating a semiconductor device including an n-type MIS transistor formed on a first active region of a semiconductor substrate and a p-type MIS transistor formed on a second active region of the semiconductor substrate, comprising the steps of:
(a) forming a first gate electrode on the first active region and forming a second gate electrode on the second active region;
(b) forming a sidewall forming film on the semiconductor substrate so as to cover the first gate electrode and the second gate electrode;
(c) reducing a thickness of the sidewall forming film in a portion thereof disposed on the second active region to be smaller than in a portion thereof disposed on the first active region;
(d) etching the sidewall forming film for exposing a part of the second active region with the first active region covered with the sidewall forming film after the step (c);
(e) forming a recess by etching the exposed part of the second active region with the sidewall forming film used as a mask and forming a strain layer in the recess after the step (d); and
(f) forming a first sidewall on a side face of the first gate electrode and a second sidewall on a side face of the second gate electrode by etching the sidewall forming film until a part of the first active region is exposed after the step (e).

7. The method for fabricating a semiconductor device of claim 6, wherein the strain layer is formed by crystal growth of silicon germanium in the recess in the step (e).

8. The method for fabricating a semiconductor device of claim 6,
wherein the sidewall forming film includes a first insulating film and a second insulating film, and
each of the first sidewall and the second sidewall includes the first insulating film with an L-shaped cross-section and the second insulating film covering the first insulating film in the step (f).

9. The method for fabricating a semiconductor device of claim 6,
wherein the step (a) includes sub-steps of:
(a1) forming a multilayered film by successively stacking a gate insulating forming film, a conducting film and a hard mask forming film on the semiconductor substrate; and
(a2) patterning the multilayered film, whereby forming a first gate insulating film, the first gate electrode and a first hard mask film on the first active region and a second gate insulating film, the second gate electrode and a second hard mask film on the second active region.

10. The method for fabricating a semiconductor device of claim 9, further comprising, before the step (b), a step of removing the first hard mask film.

11. The method for fabricating a semiconductor device of claim 6,
wherein the step (a) includes sub-steps of:
(a1) forming a multilayered film by successively stacking a gate insulating forming film, a conducting film and a hard mask forming film on the semiconductor substrate;
(a2) selectively removing a portion of the hard mask forming film disposed on the first active region; and
(a3) patterning the multilayered film, whereby forming a first gate insulating film and the first gate electrode on the first active region and a second gate insulating film, the second gate electrode and a second hard mask film on the second active region.

12. The method for fabricating a semiconductor device of claim 6, further comprising, after the step (f), a step (g) of forming n-type source/drain regions in portions of the first active region disposed outside the first sidewall.

13. The method for fabricating a semiconductor device of claim 12, further comprising the steps of:
(h) removing the first sidewall and the second sidewall after the step (g);
(i) forming n-type extension diffusion layers in portions of the first active region disposed on both sides of the first gate electrode and forming p-type extension diffusion layers in portions of the second active region disposed on both sides of the second gate electrode after the step (h); and
(j) forming a third sidewall on a side face of the first gate electrode and forming a fourth sidewall on a side face of the second gate electrode after the step (i).

14. The method for fabricating a semiconductor device of claim 6, further comprising, after the step (a) and before the step (b), a step (k) of forming n-type extension diffusion layers in portions of the first active region disposed on both sides of the first gate electrode and forming p-type extension diffusion layers in portions of the second active region on both sides of the second gate electrode.

15. The device of claim 1, wherein an upper surface of each of the strain layers is higher than a surface of a region of the second active region located directly under the second gate electrode.

16. The device of claim 4, wherein
the first insulating film is made of $SiO_2$, and
the second insulating film is made of SiN.

* * * * *